United States Patent
Son et al.

(10) Patent No.: US 6,901,014 B2
(45) Date of Patent: May 31, 2005

(54) CIRCUITS AND METHODS FOR SCREENING FOR DEFECTIVE MEMORY CELLS IN SEMICONDUCTOR MEMORY DEVICES

(75) Inventors: Young-Jae Son, Yongin-shi (KR); Uk-Rae Cho, Suwon-shi (KR); Kwang-Jin Lee, Kyunggi-go (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/445,468

(22) Filed: May 27, 2003

(65) Prior Publication Data

US 2004/0008550 A1 Jan. 15, 2004

(30) Foreign Application Priority Data

May 27, 2002 (KR) .................................. 10-2002-29200

(51) Int. Cl.$^7$ ............................................. G11C 29/00
(52) U.S. Cl. ...................... 365/200; 365/222; 365/202
(58) Field of Search ........................ 365/200, 222, 365/202, 188, 196, 189.05, 185.24, 185.01, 230.06, 230.03, 210, 226, 4, 201, 189.09, 189.11, 189.08, 154, 185.23

(56) References Cited

U.S. PATENT DOCUMENTS

| | | | | |
|---|---|---|---|---|
| 4,901,284 A | * | 2/1990 | Ochii et al. ................. | 365/226 |
| 5,604,705 A | * | 2/1997 | Ackland et al. ............ | 365/205 |
| 5,936,892 A | * | 8/1999 | Wendell ................. | 365/189.03 |
| 5,956,279 A | * | 9/1999 | Mo et al. .................... | 365/201 |
| 5,963,490 A | * | 10/1999 | Kawamura ................. | 365/201 |
| 6,081,464 A | * | 6/2000 | Marr ........................... | 365/201 |
| 6,088,286 A | * | 7/2000 | Yamauchi et al. ..... | 365/230.06 |
| 6,115,312 A | * | 9/2000 | Jefferson et al. ............ | 365/228 |
| 6,240,048 B1 | * | 5/2001 | Matsubara .................. | 365/233 |
| 6,414,890 B2 | * | 7/2002 | Arimoto et al. ............ | 365/201 |
| 6,507,529 B2 | * | 1/2003 | Fujimoto et al. ........... | 365/222 |
| 6,683,805 B2 | * | 1/2004 | Joshi et al. ................. | 365/156 |
| 6,724,648 B2 | * | 4/2004 | Khellah et al. ............. | 365/154 |

FOREIGN PATENT DOCUMENTS

| | | |
|---|---|---|
| JP | 62-289994 | 12/1987 |
| JP | 02-078095 | 3/1990 |

* cited by examiner

*Primary Examiner*—Van Thu Nguyen
*Assistant Examiner*—Dang T Nguyen
(74) *Attorney, Agent, or Firm*—F. Chau & Associates LLC; Frank V. DeRosa, Esq.

(57) ABSTRACT

Circuits and methods that enable screening for defective or weak memory cells in a semiconductor memory device. In one aspect, a semiconductor memory device comprises first and second drivers for a SRAM cell. The first driver is connected between a power supply voltage and the cell, which supplies the power supply voltage into the cell in response to a cell power control signal. The second driver is connected between the power supply signal and the cell, which supplies a voltage lower than the power supply voltage into the cell in response to the cell power down signal. A method for screening for defective or weak cells does not require a time for stabilizing a circuit condition after voltage variation to supply the voltage lower than the power supply voltage from a conventional tester because the cell power down signal activates a driver that causes a supply voltage that is lower than the power supply voltage to be loaded directly to the cell, which results in a reduction of the test time for screening defective cells.

14 Claims, 9 Drawing Sheets

CIRCUITS AND METHODS FOR SCREENING FOR DEFECTIVE MEMORY CELLS IN SEMICONDUCTOR MEMORY DEVICES

CROSS-REFERENCE TO RELATED APPLICATION

This application claims priority to Korean Patent Application No. 2002-29200, filed on May 27, 2002, which is incorporated herein by reference.

FIELD OF THE INVENTION

The present invention generally relates to semiconductor memory devices and, more specifically, to circuits and methods that enable screening for defective or weak memory cells in a semiconductor memory device.

BACKGROUND OF THE INVENTION

Due to the demand for increased data storage capacity and density of memory cells of semiconductor memory devices, such devices are being designed with smaller design rules. This demand applies to static random access memory devices (SRAMs), for example, where physical damage and topological miss-alignments in cell areas can generate defective memory cells. Defective or weak memory cells can result in abnormal leakage current flowing through the memory cells during standby states. Efficient and accurate methods for detecting or screening for defective memory cells are important for saving costs of fabrication and testing.

Figure 1:
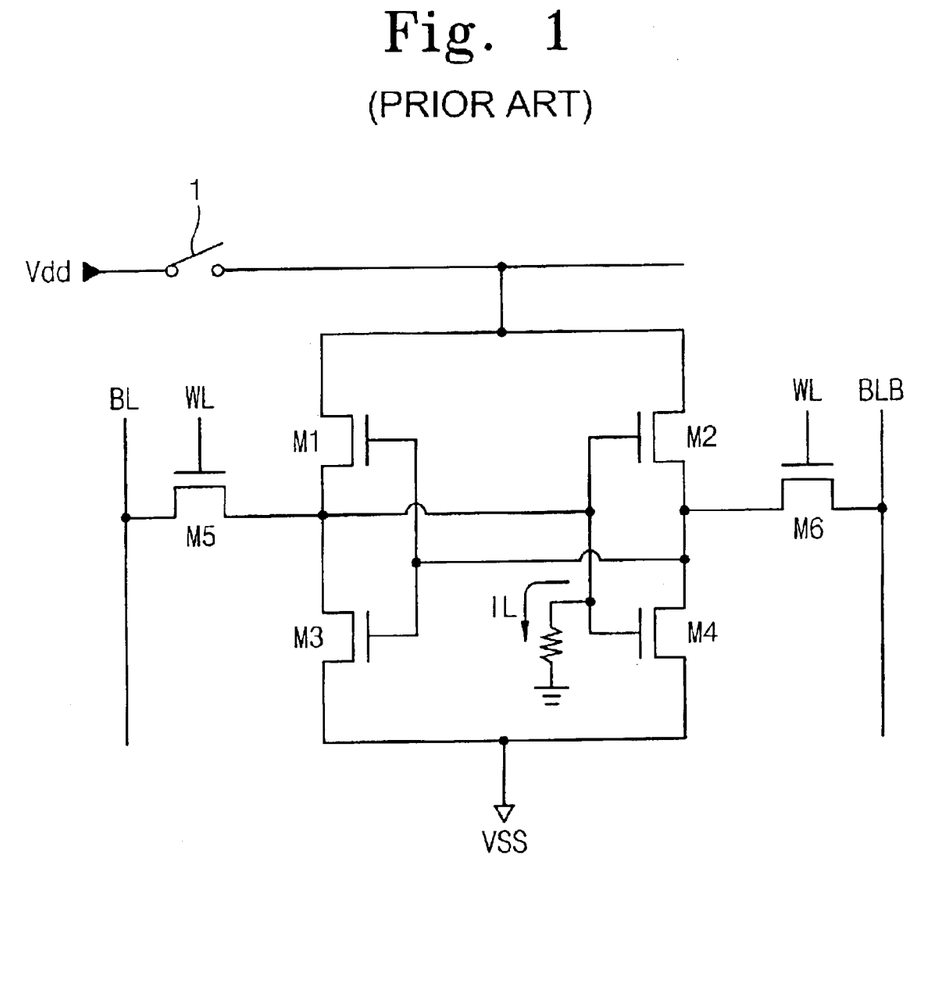
FIG. 1 is a circuit diagram of a SRAM memory cell for illustrating a conventional method for screening for defective memory cells.

One method that has been proposed for screening for defective memory cells is disclosed, for example, in Japanese Patent Publication No. 1996-312097, and is illustrated in FIG. 1 Referring to FIG. 1, a semiconductor switch 1 is connected between a power supply line Vdd and PMOS transistors M1 and M2 of a SRAM cell. Data is written into the cell when the switch 1 is turned on. The switch 1 is turned off after the writing operation and then returns to a turn-on state after a predetermined time of the turn-off state has elapsed to perform a read operation for the cell. A cell will be deemed to be defective or weak cells if the cell is not successful in reading data after it has been written with the data during the turn-on state of the switch 1.

Another technique to check defective or weak cells is to test performance of data retention in the cell (referred to as "VDR test") with a power supply voltage. In the VDR test, a modified power supply voltage level of a tester is applied into a SRAM and the data retention capability is verified after an internal power supply voltage level maintains a constant voltage level.

However, the VDR test requires modification of the power supply voltage of the tester, a power recovery time, and a time for settling the internal power supply voltage in the SRAM, which increases the testing time.

Therefore, methods and circuits for effectively and efficiently screening for defective or weak memory cells of a semiconductor memory device are highly desirable.

SUMMARY OF THE INVENTION

The present invention is directed to circuits and methods for efficiently screening for defective or weak memory cells in semiconductor memory devices.

According to one embodiment of the invention, a semiconductor memory device comprises a power supply voltage, a memory cell, a first driver for supplying the power supply voltage to the memory cell in response to a cell power control signal, and a second driver for supplying a voltage lower than the power supply voltage to the memory cell in response to a cell power down signal.

The first driver is preferably a PMOS transistor that is controlled by the cell power control signal and the second driver is preferably a NMOS transistor that is controlled by the cell power down signal.

According to another embodiment of the invention, a semiconductor memory device comprises a power supply voltage, a plurality of sub-memory blocks, each comprising a plurality of memory cells arranged in rows and columns, a plurality of column decoders and bitline sense amplifiers associated with corresponding sub-memory blocks, sub-row decoders disposed between the sub-memory blocks, and drivers for supplying the power supply voltage to the memory cells in response to a cell power control signal.

These and other embodiments, aspects, features, and advantages of the present invention will become apparent from the following detailed description of the preferred embodiments, which is to be read in connection with the accompanying drawings, in which like reference characters denote the same or similar components.

DETAILED DESCRIPTION OF PREFERRED EMBODIMENTS

Figure 2:
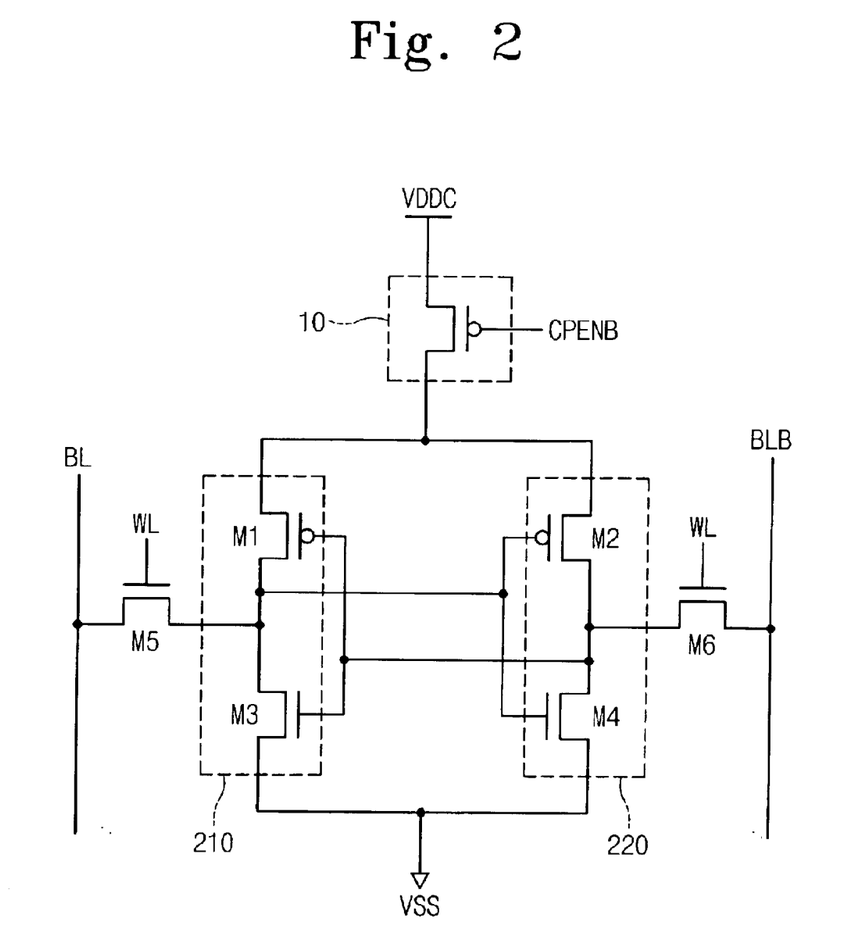
FIG. 2 is a diagram illustrating a method for screening for defective memory cells according to an embodiment of the invention.

In the following description, exemplary embodiments of the invention are discussed in detail to provide a thorough understanding of the present invention. It is to be understood, however, that the description of preferred embodiments is for purposes of illustration and that nothing herein should be construed as placing any limitation of the invention. Indeed, it will be apparent to those of ordinary skill in the art that present invention may be practiced without these specific details FIG. 2 illustrates a circuit construction that is used for screening a SRAM cell according to an embodiment of the present invention. Referring to FIG. 2, a SRAM cell comprises a CMOS-type cell, including PMOS transistors M1 and M2, and NMOS transistors M3~M6. The transistors M1~M4 are cross-coupled with their gates, drains, and sources to form latch circuits 210, 220, as is well known in the art. Each NMOS transistor M5 and M6 is connected to a respective bitline BL and BLB, and has a gate that is coupled to a common wordline WL.

The sources of PMOS transistors M1 and M2 are connected to a first internal voltage VDDC through a driver 10. Preferably, the driver 10 is a PMOS transistor which connects the first internal voltage VDDC to the sources of the PMOS transistors M1 and M2 (i.e., connects the first internal voltage VDDC to the SRAM cell) in response to a cell power control signal CPENB. With this circuit, a screening method according to the invention can use the cell power control signal CPENB to perform either a wafer-level test or a package-level test.

Figure 3:
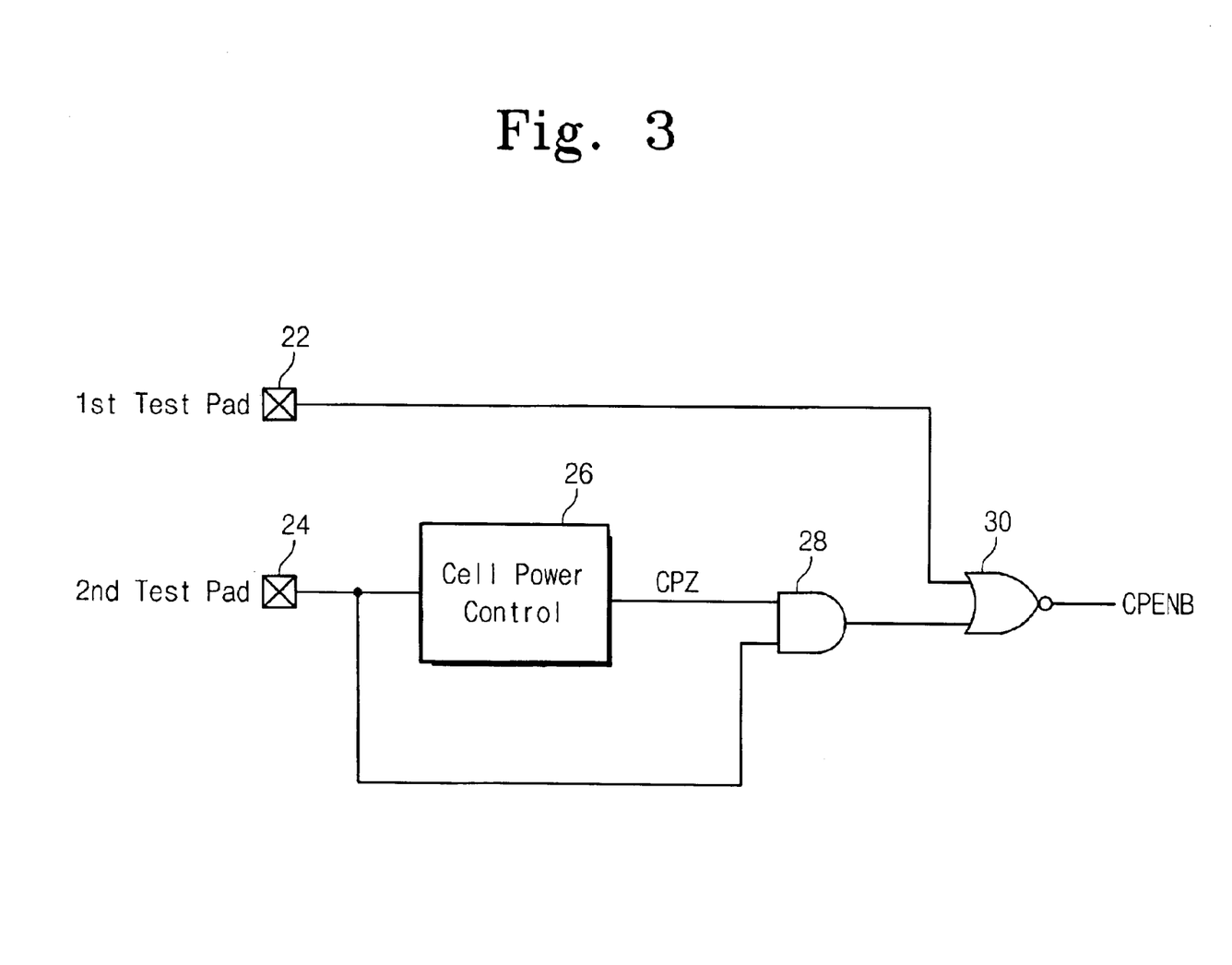
FIG. 3 is a circuit diagram of a cell power signal generator according to an embodiment of the present invention.

FIG. 3 illustrates a control circuit according to an embodiment of the present invention which is preferably used for generating the cell power control signal CPENB that controls the driver 10 (FIG. 2). The control circuit comprises first and second test pads 22 and 24, a cell power control circuit 26, an AND gate 28, and a NOR gate 30. The first test pad 22 receives an input signal for a wafer-level test mode while the second test pad 24 receives an input signal for a package-level test mode. The cell power control circuit 26 (which is preferably a type of JTAG (Joint Test Action Group) test mode circuit) generates a cell power-off signal CPZ to set a cell power-off mode for test sources to test a semiconductor memory device in response to the input signal supplied to the second test pad 24.

The AND gate 28 receives as input the cell power-off signal CPZ and the input signal from the second test pad 24, and the NOR gate 30 outputs the cell power control signal CPENB in response to an output of the AND gate 28 and the input signal from the first test pad 22.

The cell power control signal CPENB is active with a "low" logic level when the input signal from the first test pad 22 is a "high" logic level or when the output of the AND gate 28 is a "high" logic level. In FIG. 2, the driver 10 supplies the first internal voltage VDDC into the SRAM cell when the cell power control signal CPENB input to the driver 10 is a "low" logic level.

More specifically, in a wafer-level test mode, the first internal voltage VDDC is supplied into the SRAM cell in response to the cell power control signal CPENB, in response to an input pulse signal of a "high" logic level to the first test pad 22, regardless of the output of the cell power control circuit 26. In a package-level test mode, the cell power-off signal CPZ output from the cell power control circuit 26 affects the activation of the cell power control signal CPENB to supply the first internal voltage VDDC into the SRAM cell.

Figure 4:
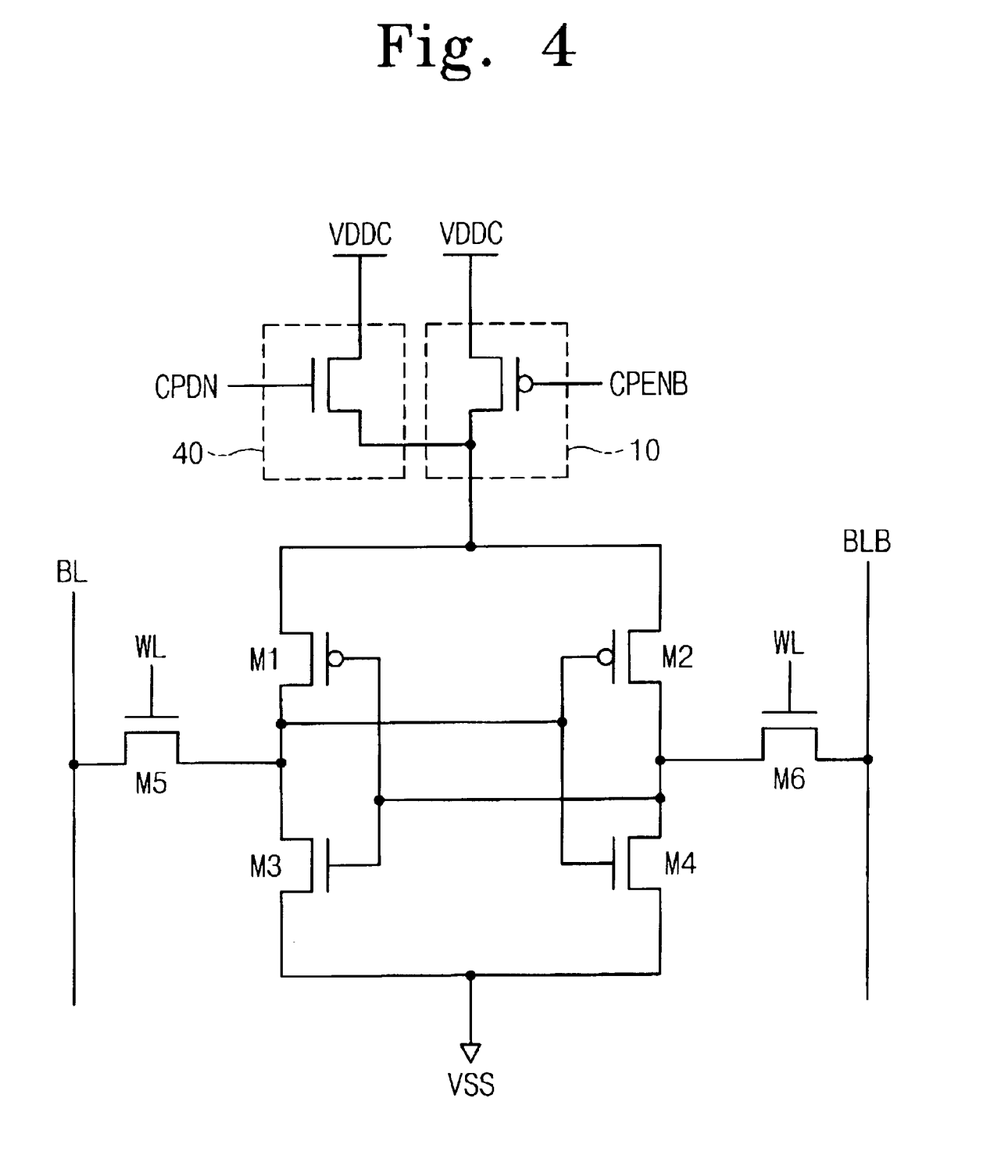
FIG. 4 is a diagram illustrating a method for screening for defective memory cells according to another embodiment of the invention.

FIG. 4 illustrates a circuit construction that is used for screening a SRAM cell according to another embodiment of the present invention. In FIG. 4, two drivers 10 and 40 are connected in parallel between the first internal voltage VDDC and the SRAM memory cell. The driver 10 is the same as in FIG. 2. The second driver 40 is preferably an NMOS transistor which connects the first internal voltage VDDC into the SRAM cell (i.e., the sources of the PMOS transistors M1 and M2) in response to a cell power down signal CPDN. With the second driver 40, the first internal voltage VDDC is lowered by a threshold voltage (Vt) of the NMOS transistor.

Figure 5:
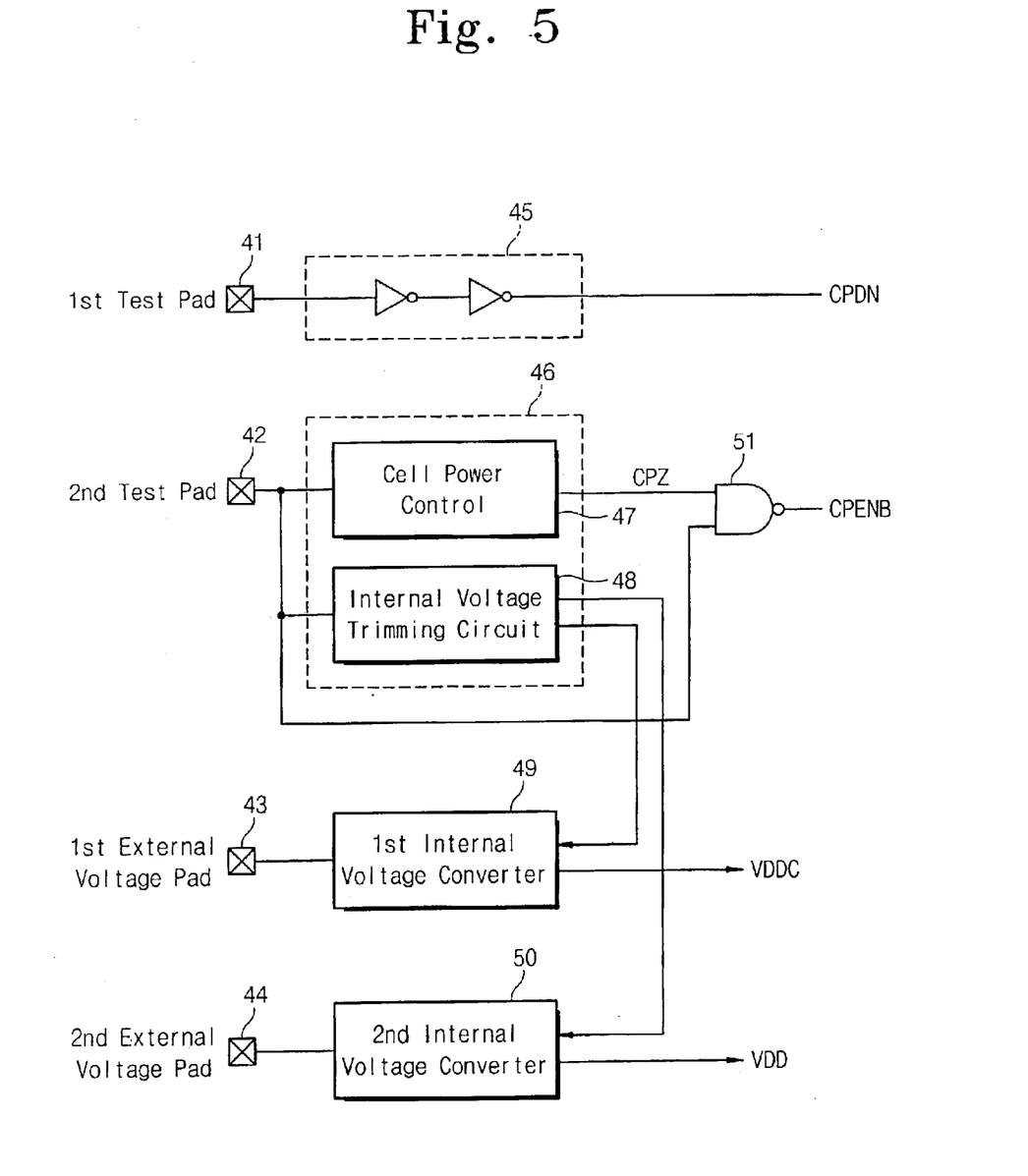
FIG. 5 is a circuit diagram illustrating a cell power signal generator according to another embodiment of the invention.

FIG. 5 is illustrates a control circuit according to another embodiment of the present invention, which is used for generating the cell power control signal CPENB that controls the driver 10 and the cell power control signal CPENB that controls driver 40. The control circuit comprises a buffer 45 connected to a first test pad 41, a JTAG test circuit 46 including a cell power control circuit 47 and an internal voltage trimming circuit 48 that are connected to a second test pad 42, a NAND gate 51 which receives the output signal CPZ of the cell power control circuit 47 and an input from the second test pad 42, and first and second internal voltage converters 49 and 50, which convert first and second external voltages 43 and 44, into first and second internal voltages VDDC and VDD, in response to an output of the internal voltage trimming circuit 48. An output of the buffer 45 is the cell power down signal CPDN and an output of the NAND gate 51 is the cell power control signal CPENB. The cell power down signal CPDN is essentially the voltage level of a signal supplied through the first test pad 41. The cell power control signal CPENB is activated with a "low" logic level in response to an input of a "high" logic level from the second test pad 42 and the output CPZ of a "high" logic level from the cell power control circuit 47. A cell power down signal CPDN having a "high" logic level turns on the second driver 40 to supply a voltage VDDC-Vt into the cell, wherein Vt is a threshold voltage of the NMOS transistor of the second driver 40. A cell power control signal CPENB having a "low" logic level turns on the first driver 10 to supply the first internal voltage VDDC into the cell.

Since the cell power control signal CPDN causes the cell to be connected directly with the voltage of VDDC-Vt, there is no waiting time for turning a voltage level lower in a tester. This advantageously provides a reduction of the test time for screening defective memory cells.

Figure 6:
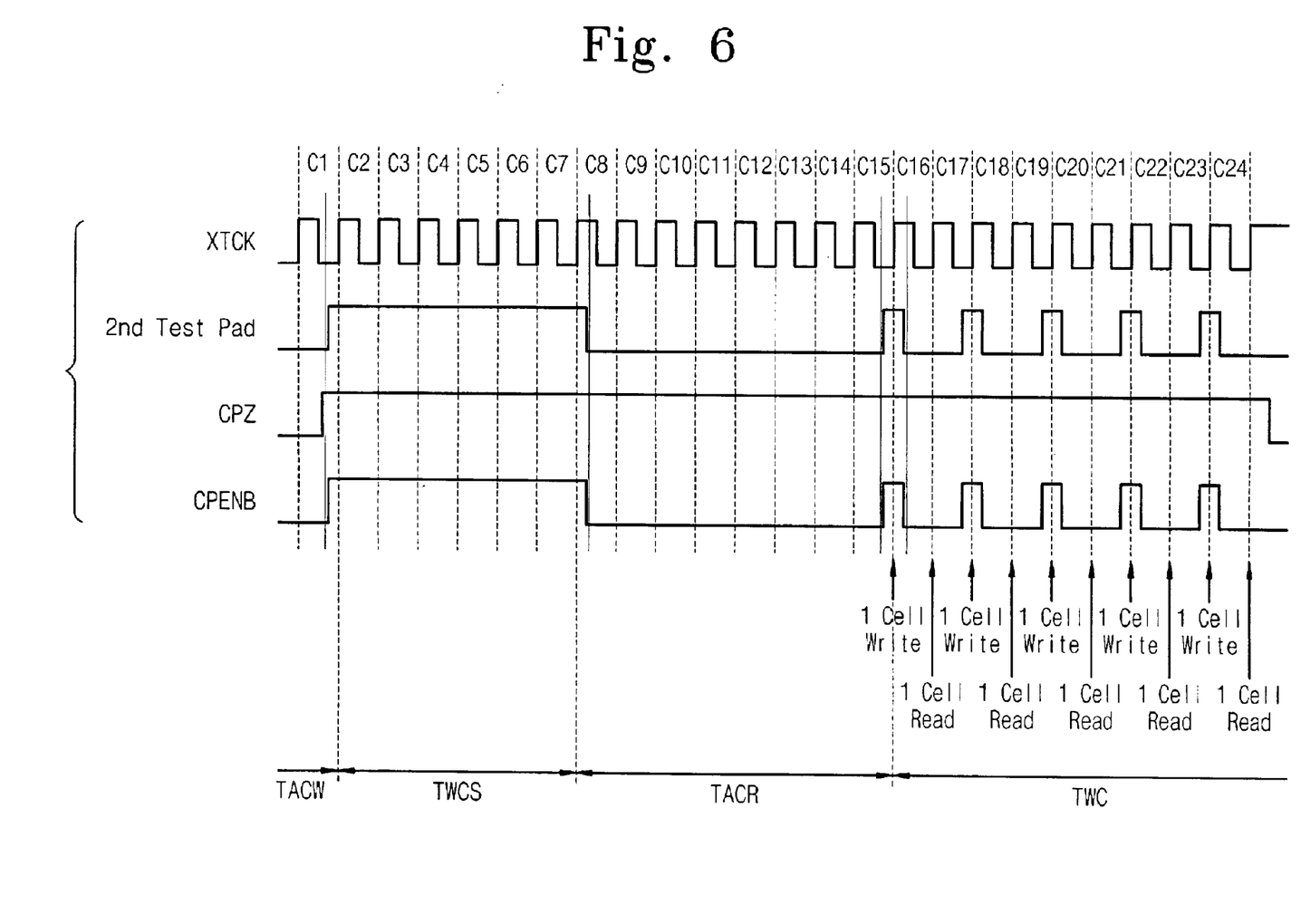
FIG. 6 is an exemplary timing diagram illustrating a method for screening for defective memory cells according to an embodiment of the invention.

FIG. 6 is an exemplary timing diagram illustrating a method for screening defective memory cells according to an embodiment of the present invention. Referring to FIG. 6, a test signal from the second test pad 42 maintains a "high" logic level during clock cycles C2~C7 of clock signal XCLK of the JTAG test circuit 46, and maintains a "low" logic level during clock cycles C8~C15. The test signal of the second test pad 42 pulses with a "high" level every two clock cycles during C16~C24. The output CPZ of the cell power control circuit 47 becomes active with a "high" logic level during the clock cycles C2~C24 which the test signal appears at the second test pad 42. The cell power control signal CPENB is generated in accordance with the test signal of the second test pad 42. When the cell power control signal CPENB is at a "high" logic level, the first internal voltage VDDC is not supplied into the cell.

Before the clock cycle C2 (period TACW), the cell power control signal CPENB of a "low" level causes the first internal voltage VDDC to be supplied into the cell and a writing operation is thereby performed for all cells. During the clock cycles C2~C7 (period TWCS) when the cell power control signal CPENB maintains a "high" logic level, the first internal voltage VDDC is not supplied into the cell, which provides a time window for performing a screening operation for defective or weak cells. After that, during the clock cycles C8~C15 (period TACR) when the cell power control signal CPENB is set to a "low" logic level, a read operation is performed for all cells.

Sub-sequent to clock cycle C16 (period TWC), read and write operations are performed for every cell. The writing operation (i.e., 1-cell writing) is performed at clock cycles C16, C18, C20, C22, and C24 while the cell power control signal is at a "high" level. At this time, each cell is compulsively put into the write mode even without a supply of the first internal voltage VDDC. Moreover, after each 1-cell writing, 1-cell read operations are carried out at clock cycles C17, C19, C21, and C23. During such operations, the read-out data is compared with the written data and defective cells are found when two data of a given cell are different from each other.

Figure 7:
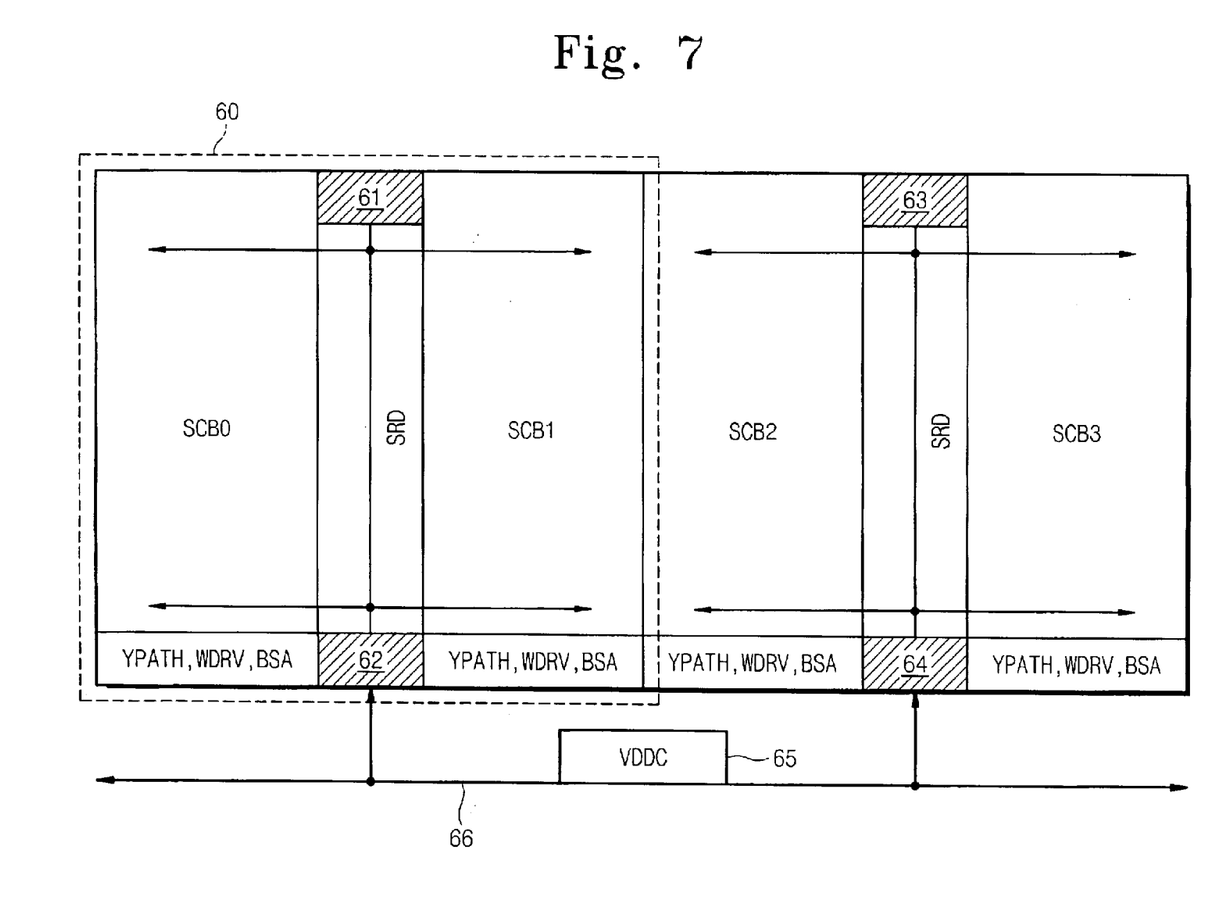
FIG. 7 schematically illustrates an architecture of a memory cell array in a SRAM memory device in which screening methods of the present invention may be implemented.

FIG. 7 schematically illustrates an architecture of a memory cell array in a SRAM memory device in which screening methods of the present invention may be implemented. In FIG. 7, a SRAM device comprises first to fourth sub-memory cell blocks SCB0~SCB3, sub-row decoders SRD, column decoders YPATH, write drivers WDRV, bitline sense amplifiers BSA, drivers 61~64, a power supply pad 65, and a power supply line 66. In the sub-memory cell blocks SCB0~SCB3, the cells are arranged in a matrix of row and columns. The column decoders YPATH, write drivers WDRV, and bitline sense amplifiers BSA are located the bottom of the sub-memory cell blocks SCB0~SCB3. The sub-row decoders SRD are interposed between the first and second sub-memory cell blocks, SCB0 and SCB1, and between the third and fourth sub-memory cell blocks, SCB2 and SCB3. A unit block 60 comprises two sub-memory cell blocks (SCB0 and SCB1, or SCB2 and SCB3), a sub-row decoder SRD, two column decoders YPATH, two write drivers WDRV, two bitline sense amplifiers BSA, and two drivers (61 and 62, or 63 and 64). The power supply pad 65 is connected to the drivers 61~64 through the power supply line 66. The drivers 61~64 preferably each comprise a PMOS transistor (such as the driver 10 shown in FIG. 2) that is disposed between the sub-row decoder SRD and the bitline sense amplifier BSA. The drivers 62 and 64 supply the first internal voltage VDDC into the memory cells arranged in the lower part of the sub-memory cell blocks. The drivers 61 and 63 are disposed at the upper side of the sub-row decoder SRD and supply the first internal voltage VDDC into the memory cells arranged in the tipper part of the sub-memory cell blocks.

Figure 8:
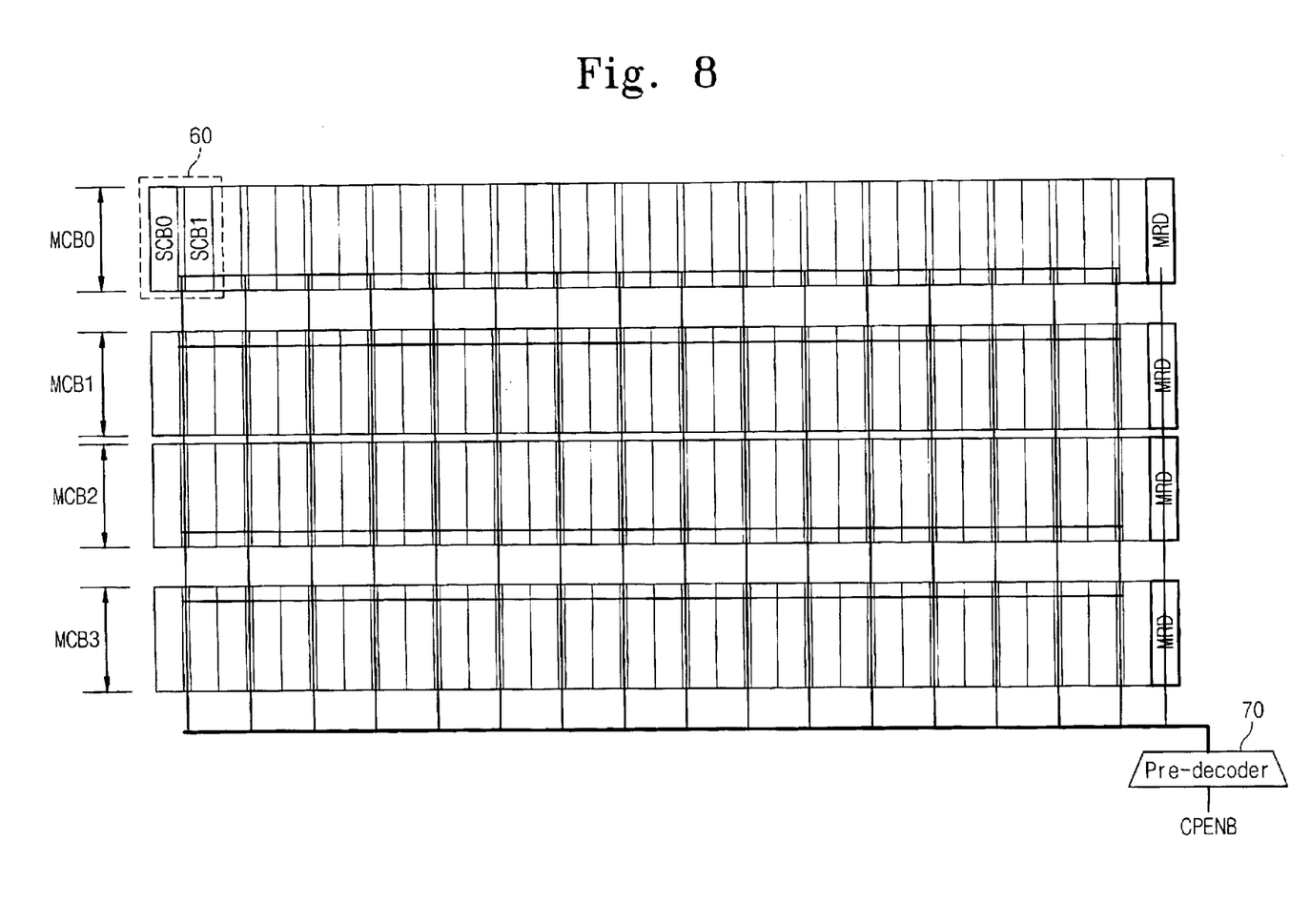
FIG. 8 is a schematic diagram of a memory cell array that is capable of performing screening of a block of memory cells according to an embodiment of the invention.
Figure 9:
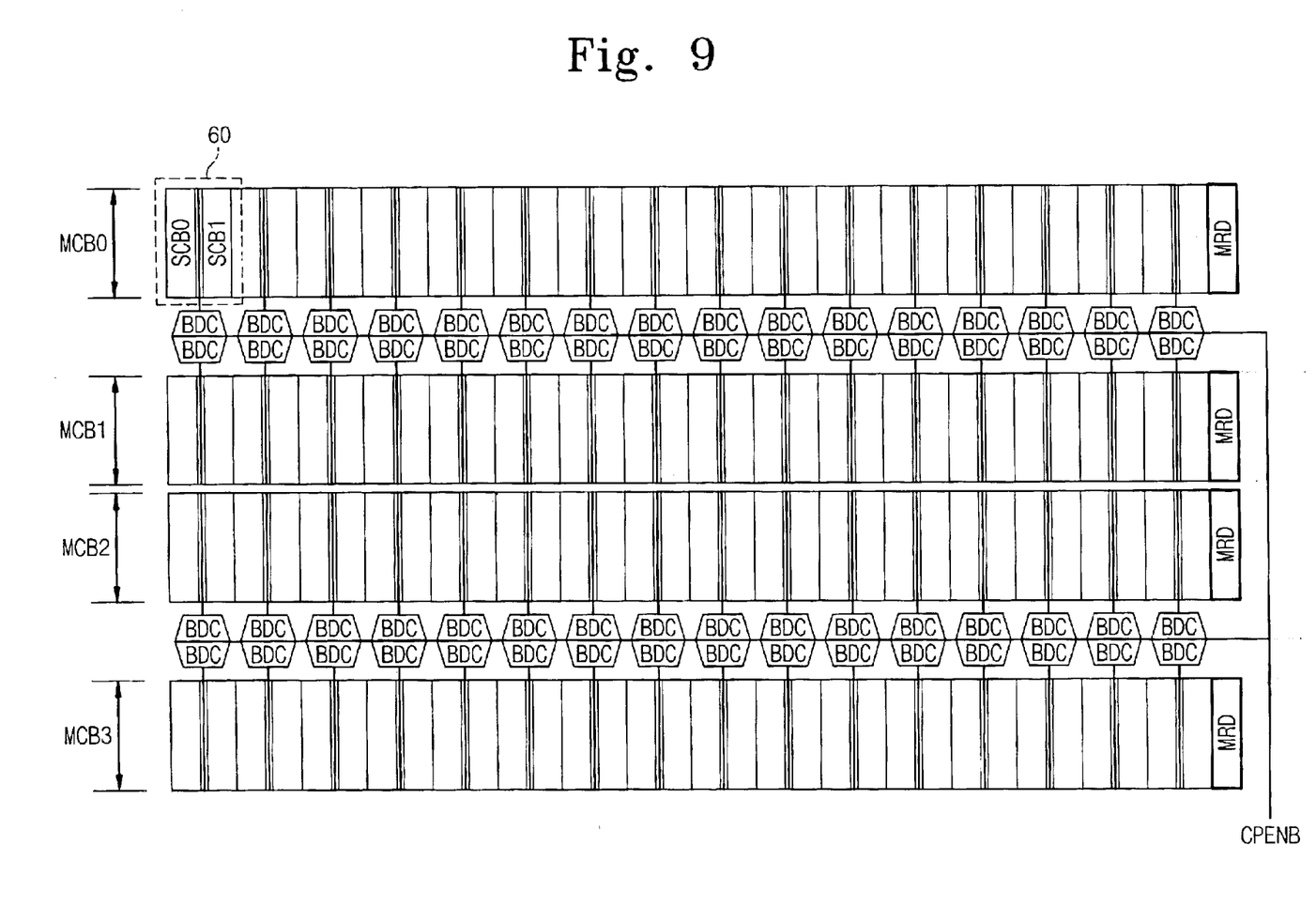
FIG. 9 is a schematic diagram of a memory cell array that is capable of performing screening of a block of memory cells according to another embodiment of the invention.

FIGS. 8 and 9 are schematic diagrams of a memory cell arrays that are capable of performing screening of memory cells blocks according to embodiments of the invention, wherein a power control signal CPENB is used as decoding signals for blocks of memory cell. In FIGS. 8 and 9, the unit blocks 60 of FIG. 7 are arranged in main memory cell blocks MCB0~MCB3. Each main memory cell block is coupled to a main row decoder MRD for selecting the sub-memory cell blocks SCB0~SCB3 embedded in the main memory cell block.

More specifically, in FIG. 8 the cell power control signal CPENB is applied to a pre-decoder 70 for performing a screening process for all the main blocks. An output of the pre-decoder 70 is applied to the main row decoders MRD. When the cell power control signal CPENB is enabled, the main row decoders MRD are activated and the first internal voltage VDDC is supplied into the main memory cell blocks MCB0~MCB3.

On the other hand, in FIG. 9, the cell power control signal CPENB is applied to each of a plurality of block decoders BDC. When the cell power control signal CPENB is enabled to supply the first internal voltage VDDC into each of the sub-cell blocks SCB0~SCB3, the main row decoders MRD select the sub-memory cell block to be supplied with the first internal voltage VDDC. Thus, the decoding of the cell power control signal CPENB may allow different screen modes, one mode for screening entire cell blocks or another mode for screening one or more cell block units.

As described above, circuits and methods for screening for defective or weak memory cells according to the present invention provide a reduced test time for screening since no time is needed for settling a test voltage lower than the power supply voltage in a tester.

Moreover, the invention enables screening operations in either a wafer-level test mode or a package-level test mode in accordance with a test signal supplied through a test pad. Furthermore, screen operations can be performed for either entire memory cell blocks or for memory cell block units, which provides flexibility of the number of memory cell blocks to be tested.

Although preferred embodiments of the present invention have been described for illustrative purposes, those of ordinary skill in the art will appreciate that various modifications, additions and substitutions are possible, without departing from the scope and spirit of the invention. For example, the present invention may be applicable to screen operations for other type memory cells not the SRAM cells. It is to be understood that all such changes and modifications are intended to be included within the scope of the invention as defined by the appended claims.

What is claimed is:

1. A semiconductor memory device comprising:
    a power supply voltage;
    a memory cell;
    a first driver for supplying the power supply voltage to the memory cell in response to a cell power control signal;
    a second driver for supplying a voltage lower than the power supply voltage to the memory cell in response to a cell power down signal; and
    a control circuit for generating the cell power control signal, the control circuit comprising:
        a first test pad;
        a second test pad;
        a cell power control circuit for setting a cell power-off mode in response to an input from the second test pad;
        a first gate circuit for receiving an output of the cell power control circuit and the input from the second pad; and
        a second gate circuit for generating the cell power control signal in response to an output of the first gate circuit and an input from the first test pad.

2. The device of claim 1, wherein the first driver is a PMOS transistor that is controlled by the cell power control signal.

3. The device of claim 1, wherein the second driver is a NMOS transistor that is controlled by the cell power down signal.

4. The device of claim 1, wherein the memory cell is a SRAM (static random access memory) cell.

5. The device of claim 1, wherein the cell power control circuit comprises a JTAG test circuit.

6. A semiconductor memory device comprising:
    a power supply voltage;
    a memory cell;
    a first driver for supplying the power supply voltage to the memory cell in response to a cell power control signal;
    a second driver for supplying a voltage lower than the power supply voltage to the memory cell in response to a cell power down signal; and
    a control circuit for generating the cell power control signal and the cell power down signal, the control circuit comprising:
        a first test pad;
        a second test pad;

a cell power control circuit for setting a cell power-off mode in response to an input from the second test pad; and a gate circuit for generating the cell power control signal in response to an output of the cell power control circuit and the input from the second test pad.

7. The device of claim 6, wherein the control circuit further comprises:

an external voltage pad; and a voltage converter for converting a voltage supplied through the external voltage pad into the power supply voltage.

8. The device of claim 6, wherein the cell power control circuit comprises a JTAG test circuit.

9. A method of screening defective memory cells in a semiconductor memory device, comprising the steps of:

writing data into a memory cell, during a first period of time;

stopping a supply of a power supply voltage into the memory cell in response to a cell power control signal having a first logic state during a second period of time subsequent to the first period of time;

supplying the power supply voltage into the memory cell in response to the cell power control signal having a second logic state and reading data from the memory cell, during a third period of time subsequent to the second period of time; and writing data into the memory cell after the cell power control signal transits to the first logic state to stop the supply of the power supply voltage to the cell and then reading data from the memory cell after the cell power control signal transits to the second logic state to enable the supply of the power supply signal to the cell, during a fourth period of time subsequent to the third period of time.

10. The method of claim 9, further comprising a step of generating the cell power control signal according to a test signal using a JTAG test circuit.

11. A semiconductor SRAM (static random access memory) device comprising:

a power supply voltage;

a plurality of sub-memory blocks, each comprising a plurality of SRAM memory cells arranged in rows and columns;

a plurality of column decoders and bitline sense amplifiers associated with corresponding sub-memory blocks;

sub-row decoders disposed between the sub-memory blocks;

drivers for selectively supplying the power supply voltage to the sub-memory blocks of SRAM memory cells in response to a cell power control signal; and a plurality of main memory blocks, each main memory block comprising an arrangement of unit blocks, wherein each unit block comprises two sub-memory blocks, a sub-row decoder, and two drivers, wherein each main memory block is addressable by main row decoders, wherein the cell power control signal is applied to a pre-decoder to activate the main row decoders, which controls a supply of the power supply voltage to the memory cells of one or more of the main memory blocks.

12. The device of claim 11, wherein the drivers are disposed in conjunction areas between the sub-row decoder and the bitline sense amplifiers.

13. A semiconductor memory device comprising:

a power supply voltage;

a memory cell;

a first driver for supplying the power supply voltage to the memory cell in response to a cell power control signal;

a control circuit for generating the cell power control signal in response to a test control signal, wherein the control circuit comprises:

a first test pad;

a second test pad;

a cell power control circuit for setting a cell power-off mode in response to an input from the second test pad; and a gate circuit for generating the cell power control signal in response to an output of the cell power control circuit and the input from the second test pad.

14. The device of claim 13, wherein the test control signal specifies one of a package-level test mode and a wafer-level test mode.

* * * * *